United States Patent [19]

Ahne et al.

[11] Patent Number: 4,849,051
[45] Date of Patent: Jul. 18, 1989

[54] HEAT RESISTANT POSITIVE RESISTS AND METHOD FOR PREPARING HEAT-RESISTANT RELIEF STRUCTURES

[75] Inventors: Hellmut Ahne, Roettenbach; Albert Hammerschmidt, Erlangen, both of Fed. Rep. of Germany

[73] Assignee: Siemens Aktiengesellschaft, Berlin & Munich, Fed. Rep. of Germany

[21] Appl. No.: 191,566

[22] Filed: May 9, 1988

[30] Foreign Application Priority Data

May 18, 1987 [DE] Fed. Rep. of Germany ....... 3716627

[51] Int. Cl.⁴ .......................... B44C 1/22; B05D 3/06; G03C 1/68; G03C 5/00
[52] U.S. Cl. ................. 156/659.1; 156/668; 156/904; 427/43.1; 430/283; 430/296; 430/323; 430/955
[58] Field of Search ............... 430/283–296, 430/323, 955; 427/43.1; 156/643, 659.1, 668, 904

[56] References Cited

U.S. PATENT DOCUMENTS

| Re. 30,186 | 1/1980 | Rubner et al. | 430/325 |
| 2,904,537 | 9/1959 | Brinker et al. | 260/78 |
| 3,332,907 | 7/1967 | Angelo et al. | 260/47 |
| 3,644,288 | 2/1972 | Odier et al. | 260/47 |
| 3,852,239 | 12/1974 | Bellmann et al. | 360/46.5 |
| 3,957,512 | 5/1976 | Kleeberg et al. | 96/35.1 |
| 4,093,461 | 6/1978 | Loprest et al. | 96/36 |
| 4,339,521 | 7/1982 | Ahne et al. | 430/192 |
| 4,395,482 | 7/1983 | Ahne et al. | 430/326 |
| 4,415,653 | 11/1983 | Lai et al. | 430/296 |
| 4,568,601 | 2/1986 | Araps et al. | 427/43.1 X |

FOREIGN PATENT DOCUMENTS

| 23662 | 5/1983 | European Pat. Off. |
| 2437348 | 2/1976 | Fed. Rep. of Germany. |
| 2631535 | 2/1977 | Fed. Rep. of Germany. |
| 2647004 | 4/1978 | Fed. Rep. of Germany. |
| 1467620 | 12/1966 | France. |
| 1548308 | 10/1968 | France. |
| 2189454 | 1/1974 | France. |

Primary Examiner—William A. Powell
Attorney, Agent, or Firm—Kenyon & Kenyon

[57] ABSTRACT

The invention provides heat-resistant positive resists and methods for preparing heat-resistant relief structures therefrom. The positive resists are based upon polybenzoxazole precursor stages and diazoquinones. The polybenzoxazole precursor stages are hydroxypolyamides with the following structure:

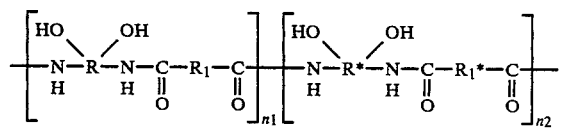

where R, R*, $R_1$ and $R_1$* are aromatic groups; $n_1$ and $n_2 = 1$ to 100; and R≠R* and/or $R_1$≠$R_1$*.

19 Claims, No Drawings

HEAT RESISTANT POSITIVE RESISTS AND METHOD FOR PREPARING HEAT-RESISTANT RELIEF STRUCTURES

BACKGROUND OF THE INVENTION

The invention relates to heat-resistant positive resists based upon oligomeric and/or polymeric polybenzoxazole precursor stages and diazoquinones as well as to a method for preparing heat-resistant relief structures from such positive resists.

Heat-resistant and highly heat resistant photo resists are required for cost-effective direct production of structured insulating layers. The resist materials and the corresponding relief structures must not decompose when subjected to the high temperatures used during the production of the insulating layers. Moreover, the relief structures must not be deformed upon the softening of the polymer material, rather, they must be dimensionally stable.

Conventional positive resists, for instance, on the basis of Novolaks, are suitable for use at high temperatures since they get soft in the process and the polymer chains are broken. High-temperature resistant negative resists are known, for instance, from German Patents 23 08 830 and 24 37 348, however, these resists are subject to the disadvantages which are associated with negative-performing photo varnishes, such as negative flanks, relatively long exposure times, relatively low resolution and the need to use ecologically undesirable developers.

From DE-OS 26 31 535, a heat-resistant positive resist on the basis of polyamidocarboxylic acid/diazoquinone is known. However, this positive resist has a number of disadvantages such as limited storage life, insufficient stability in alkaline etching solutions and a low solubility difference between exposed and unexposed areas.

The foregoing disadvantages are avoided if positive resists are manufactured based upon oligomeric and/or polymeric precursor stages of polyoxazoles and diazoquinones (see European Patent 0 023 662). The polyoxazole precursor stages are polycondensation products of aromatic and/or heterocyclic diaminodihydroxy compounds and dicarboxylic acid chlorides or esters. Precursor stages of polybenzoxazoles are preferred.

It is, therefore, an object of the invention to provide highly heat resistant positive resists based upon polybenzoxazole precursor stages and diazoquinones which are inexpensive to manufacture.

It is a further object of the invention to provide positive resists with a new spectrum of properties, particularly with high resolution.

SUMMARY OF THE INVENTION

The invention provides positive resists based upon polybenzoxazole precursor stages which are hydroxypolyamides with the following structure:

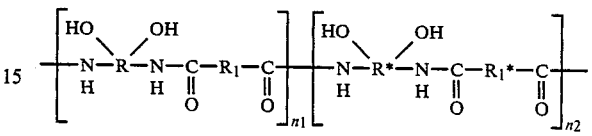

wherein R, R*, $R_1$ and $R_1$* are aromatic groups and the following applies with respect to $n_1$ and $n_2$: $n_1$ and $n_2 = 1$ to 100 with the provision $R \neq R^*$ and/or $R_1 \neq R_1^*$.

The hydroxypolyamides of the kind mentioned above are polycondensation products and, more specifically, copolycondensation products of aromatic diaminodihydroxy compounds and aromatic dicarboxylic acids or dicarboxylic acid chlorides. Either two different diaminodihydroxy compounds and one dicarboxylic acid (or acid chloride), or two different dicarboxylic acids (or their acid chlorides) and one diaminodihydroxy compound can be used to synthesize the copolycondenation products. Alternatively, two different diaminodihydroxy compounds and two different dicarboxylic acids (or their acid chlorides) can also be used in the synthesis.

The positive resists according to the invention exhibit excellent resolution. Furthermore, the hydroxypolyamids contained in these photo resists are easy to prepare and can be manufactured at low cost. By employing different dicarboxylic acids or acid chlorides and/or different diaminodihydroxy compounds in the same polymer precursor stage, a special spectrum of properties can be generated, such as low moisture absorption and high solubility.

DETAILED DESCRIPTION OF THE INVENTION

The hydroxypolyamides of the type mentioned above are preferably comprised of aromatic groups with the following structures:

R and R* can have the following meaning:

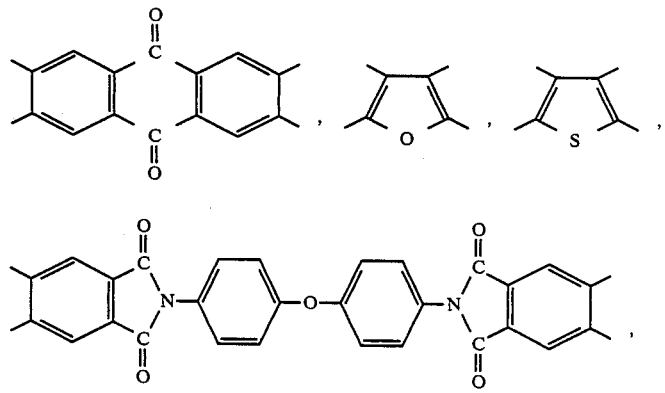

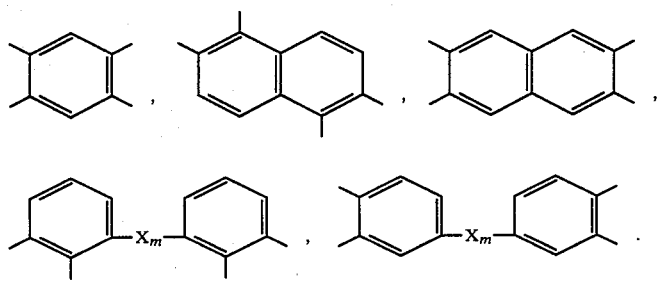

$R_1$ and $R_1^*$ can have the following meaning, where H-atoms can also be substituted by Cl or Br:

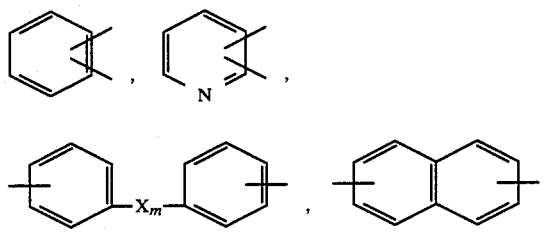

where, $m=0$ or $1$, and X means:

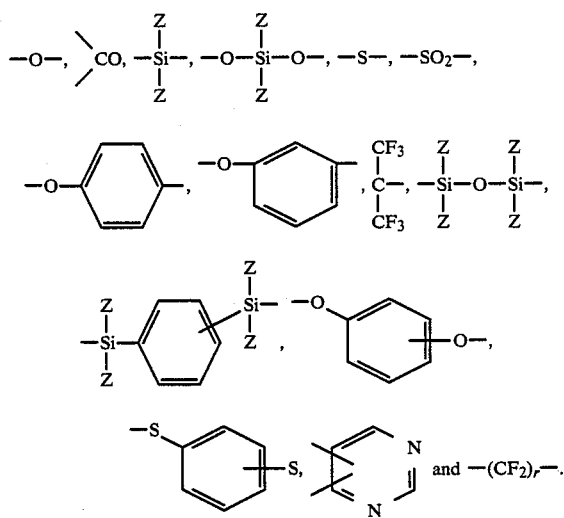

Here, the following applies:
$Z$=alkyl with 1 to 10 carbon atoms or aryl, and $r=2$ to 18.

The hydroxypolyamides are synthesized from aromatic diaminodihydroxy compounds and aromatic dicarboxylic acids or acid chlorides. Preferred diaminodihydroxy compounds are 3,3'-dihydroxybenzidine and 2,2-bis(3-amino-4-hydroxyphenyl)-1,1,1,3,3,3-hexafluoropropane. Isomers of these compounds can also be used as well as other hydroxyl-group-containing aromatic diamines such as 3,3'-dihydroxy-4,4'-diaminodiphenyl ether. As the dicarboxylic acid chloride, isophthalic acid dichloride is preferred; however, isophthalic acid, terephthalic acid and its dichloride can also be used.

In the positive resists according to the invention, light-sensitive diazoquinones are used as photoreactive additives, especially o-quinone and o-naphthoquinone diazides (see in this connection European Patent 0 023 662). Preferred are esters or amides of the 6-diazo-5(6)-oxo-1-naphthalene sulfonic acid, especially the bisnaphthoquinone-[1,2]-diazide-(2)-5-sulfonic acid ester of $\beta,\beta$-bis(4-hydroxyphenyl)-propane. The weight ratio of hydroxypolyamide and diazoquinone is between 1:20 and 20:1, and preferably between 1:10 and 10:1.

For manufacturing heat-resistant relief structures, a positive resist in the form of a layer or foil is applied to a substrate and is either exposed to actinic light through a mask or is irradiated by guiding a light, electron or ion beam according to a set pattern. Subsequently, the exposed or irradiated layer or foil parts are dissolved or pulled off and the relief structures so obtained are then annealed.

The photo resist can be dissolved in an organic solvent and applied to the substrate. N-methylpyrrolidone is a preferred solvent. However, other organic solvents with similar properties can also be used such as dimethyl formamide and N,N-dimethyl acetamide, as well as mixtures thereof.

Additives for improving the adhesion and/or the wetting of the solution may also be used in the solution. The solution may be applied to the substrate by means of a centrifuging technique. However, other coating methods such as immersion, spraying, brushing or rolling, can also be used. Alternatively, adhesion agents or wetting agents can be applied directly to the substrate before applying the solution. The substrate is preferably a glass, a metal, especially aluminum, a plastic or a semiconducting material.

The concentration of the resist solution is adjusted so that layer thicknesses of 0.01 $\mu$m, to several 100 $\mu$m can be produced. It has been found that when the centrifugal coating method is used, 300 to 10,000 rpm for 1 to 100 seconds is suitable for obtaining a uniform and good surface quality.

After the solution is applied to the substrate, the solvent is removed, i.e., drying is performed. This can take place at room temperature or at elevated temperature; the solvent is preferably removed at a temperature between 50° and 120° C. The solvent may be removed in a vacuum.

To obtain a sufficient solubility difference between the irradiated and the non-irradiated layers or foil parts of the positive resists, exposure times between 1 and 600 seconds are sufficient when using a very high-pressure mercury lamp. The choice of such exposure time usually will be function of the resist composition used and the layer thickness. After exposure, the exposed parts of the layer or foil are dissolved with an aqueous alkaline developer.

By means of the positive resist according to the invention, images with sharp contours, i.e., relief structures are obtained which are converted by annealing into highly heat resistant polybenzoxazoles. In general, temperatures between 200° and 500° C. are chosen. The annealing preferably takes place at a temperature between 300° and 400° C. The annealing process itself is generally carried out within a time of 0.1 to 8 hours and preferably within 1 to 4 hours.

The relief structures produced by the method according to the invention can be applied for generating passivating layers on semiconductor components, thin and thick-film circuits, solder protection layers on multilayer circuits, insulating layers as parts of multilayer circuits and miniaturized insulating layers on electrically conducting and/or semiconducting and/or insulating base materials especially in the field of microelectronics or generally for fine structuring of substrates. The highly heat-resistant relief structures serve as masks for wet and dry etching processes, for electroless or electroplating metal deposition, for vapor deposition methods, and for ion implantation. The relief structures also serve as insulating and protection layers in electrotechnology. These relief structures can also be used as orientation layers, for instance, in liquid crystal displays as well as for rastering surfaces, for instance, in X-ray screens, and especially X-ray image amplifiers.

The invention will be described in greater detail with the aid of the following embodiment examples.

EXAMPLE 1

Preparation of a Polymer Precursor Stage 60 parts by weight 2,2-bis-(3-amino-4-hydroxyphenyl)-1,1,1,3,3,3-hexafluoropropane and 34.4 parts by weight 3,3'-dihydroxybenzidine are dissolved in 650 parts by weight N.N-dimethylacetamide. After adding 140 parts by weight pyridine, 59.5 parts by weight isophthalic acid dichloride dissolved in 265 parts by weight cyclohexanone are added drop wise within 2 hours at 0° C. while stirring heavily. The viscous solution is subsequently stirred for 1 hour at 0° C. and is let to stand for 12 hours at room temperature. Subsequently, the solution is added dropwise in 10,000 parts by weight distilled water while stirring heavily. The resin precipitated in the process is suctioned off, dried in a vacuum and washed with methanol.

EXAMPLE 2

Preparation of a Relief Structure

A resist solution consisting of 3 parts by weight of the polymer prepared in accordance with EXAMPLE 1 and 0.6 parts by weight of the bis-napthoquinone-[1.2]-diazide-(2)-5-sulfonic acid ester of $\beta,\beta$-bis(4-hydroxyphenyl)-propane as the photoreactive component, dissolved in 13 parts by weight N-methylpyrrolidone, is pressure-filtered through a 0.8 μm filter. The finished solution is then centrifuged at 3,000 rpm on a silicon wafer provided with an adhesion agent and is dried for 15 minutes at 80° C. (layer thickness: 1.6 μm). The coated silicon wafer is contact exposed by means of a 350-W mercury vapor very-high-pressure lamp (power: 23 mW/cm$^2$) for 6 to 7 seconds and developed for 35 seconds (developer Shipley Microposit 303, diluted with water in the ratio 1:40) and annealed at 400° C. In the process, fine, highly heat-resistant structures are obtained (<1.6 μm).

The annealed polymer has the following properties (r.h=relative humidity):

dielectric constant $\epsilon$ (at 25° C., 0% r.h.)=2.9;

loss angle tan $\delta$ (at 25° C., 0% r.h.)=3.9×10$^{-3}$;

moisture absorption (0% to 100% r.h.)=2.2% (at 25° C.).

What is claimed is:

1. A heat-resistant positive resist comprising an oligomeric polymeric polybenzoxazole precursor stage and a diazoquinone, wherein the polybenzoxazole precursor stage comprises hydroxypolyamides of the following structure:

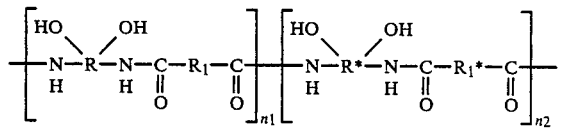

wherein R, R*, R$_1$ and R$_1$* are aromatic groups; n$_1$ and n$_2$=1 to 100; and where R≠R* and/or R$_1$≠R$_1$*.

2. A positive resist according to claim 1 wherein the hydroxypolyamides are polycondensation products of aromatic diaminodihydroxy compounds and aromatic dicarboxylic acids or dicarboxylic acid chlorides.

3. A positive resist according to claim 2, wherein the hydroxypolyamides are polycondensation products of 3,3'-dihydroxybenzidine, 2,2-bis-(3-amino-4-hydroxy phenyl)-1,1,1,3,3,3-hexafluoro propane and isophthalic acid dichloride.

4. A positive resist according to claim 1 wherein the diazoquinone is an ester or an amide of 6-diazo-5(6)-oxo-1-naphthalene sulfonic acid.

5. A positive resist according to claim 2 wherein the diazoquinone is an ester or an amide of 6-diazo-5(6)-oxo-1-naphthalene sulfonic acid.

6. A positive resist according to claim 3 wherein the diazoquinone is an ester or an amide of 6-diazo-5(6)-oxo-1-naphthalene sulfonic acid.

7. A positive resist according to claim 1 wherein the weight ratio of hydroxypolyamides to the diazoquinones is between 1:20 and 20:1.

8. A method for the preparation of a heat-resistant relief structure comprising the steps of:

(1) applying a positive resist, in the form of a layer or foil, to a substrate, said positive resist comprising oligomeric or polymeric polybenzoxazole precursor stages and diazoquinones, wherein the polybenzoxazole precursor stages comprise hydroxypolyamides with the following structure:

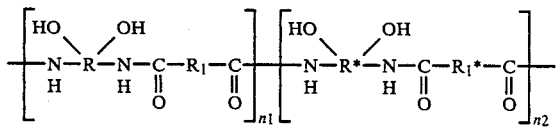

where R, R*, R$_1$ and R$_1$* are aromatic groups; n$_1$ and n$_2$=1 to 100; and where R≠R* and/or R$_1$≠R$_1$*, (2) irradiating said positive resist with actinic light through a mask, or by guiding a light, electron or ion bem according to a set pattern;

(3) removing the layer or foil portions of the positive resist which have been irradiated to obtain said relief structure; and (4) annealing said relief structure.

9. A method according to claim 8 wherein the hydroxypolyamides are polycondensation products of aromatic diaminodihydroxy compounds and aromatic dicarboxylic acids or dicarboxylic acid chlorides.

10. A method according to claim 9 wherein the hydroxypolyamides are polycondensation products of 3,3'-dihydroxybenzidine, 2,2-bis-(3-amino-4-hydroxy phenyl)-1,1,1,3,3,3-hexafluoropropane and isophthalic acid dichloride.

11. A method according to claim 8 wherein the diazoquinone is an ester or an amide of 6-diazo-5(6)-oxo-1-naphthalene sulfonic acid.

12. A method according to claim 8 wherein the weight ratio of hydroxypolyamides to the diazoquinones is between 1:20 and 20:1.

13. A method according to claim 8 wherein the positive resist is dissolved in an organic solvent when it is applied to the substrate.

14. A method according to claim 13 wherein N-methylpyrrolidone is used as the solvent.

15. A method according to claim 13 wherein the solvent contains an adhesion agent.

16. A method according to claim 8 wherein the positive resist is applied to the substrate by means of a centrifuging technique.

17. A method according to claim 8 wherein the substrate is comprised of glass, metal, plastic or semiconductive material.

18. A method according to claim 8 wherein the relief structure is annealed at a temperature between 200° and 500° C.

19. A method according to claim 13 wherein the solvent contains a wetting agent.

* * * * *